(12) United States Patent
Yao

(10) Patent No.: US 11,892,521 B2
(45) Date of Patent: Feb. 6, 2024

(54) SEMICONDUCTOR DEVICE WITH CONTACT CHECK CIRCUITRY

(71) Applicant: ELITE SEMICONDUCTOR MICROELECTRONICS TECHNOLOGY INC., Hsinchu (TW)

(72) Inventor: Tse-Hua Yao, Hsinchu (TW)

(73) Assignee: ELITE SEMICONDUCTOR MICROELECTRONICS TECHNOLOGY INC., Hsinchu (TW)

(*) Notice: Subject to any disclaimer, the term of this patent is extended or adjusted under 35 U.S.C. 154(b) by 0 days.

(21) Appl. No.: 17/406,121

(22) Filed: Aug. 19, 2021

(65) Prior Publication Data

US 2023/0057897 A1    Feb. 23, 2023

(51) Int. Cl.
G01R 31/68     (2020.01)
G01R 1/067     (2006.01)
H01L 23/525    (2006.01)

(52) U.S. Cl.
CPC ......... G01R 31/68 (2020.01); G01R 1/06794 (2013.01); H01L 23/5256 (2013.01)

(58) Field of Classification Search
CPC .. G01R 31/68; G01R 1/06794; H01L 23/5256
See application file for complete search history.

(56) References Cited

U.S. PATENT DOCUMENTS

| | | | |
|---|---|---|---|
| 5,886,530 A * | 3/1999 | Fasnacht | G01R 31/66 324/754.1 |
| 5,962,868 A | 10/1999 | Tanida | |
| 7,622,940 B2 * | 11/2009 | Kim | G01R 1/06794 324/750.3 |
| 2009/0039909 A1 | 2/2009 | Kim | |
| 2017/0243797 A1 * | 8/2017 | Kim | H01L 22/34 |

* cited by examiner

Primary Examiner — Lee E Rodak

(57) ABSTRACT

A semiconductor device with contact check circuitry is provided. The semiconductor device includes a plurality of pads, an internal circuit, and a contact check circuit. The plurality of pads includes a first pad and a second pad. The internal circuit is coupled to the plurality of pads. The contact check circuit, at least coupled to the first pad and the second pad, is used for checking, when the semiconductor device is under test, contact connections to the first pad and the second pad to generate a check result signal according to comparison of a first test signal and a second test signal received from the first pad and the second pad with at least one reference signal.

7 Claims, 3 Drawing Sheets

SEMICONDUCTOR DEVICE WITH CONTACT CHECK CIRCUITRY

BACKGROUND OF THE INVENTION

1. Field of the Invention

The present disclosure relates to an integrated circuit, and in particular to a semiconductor device with contact check circuitry.

2. Description of the Related Art

In electronic products, electronic fuse (e-fuse) is a technology which allows for the dynamic real-time reprogramming of a semiconductor device (or chip). In the abstract, computer logic is generally "etched" or "hard-coded" onto a chip and cannot be changed after the chip has finished being manufactured. By utilizing a set of e-fuses in the semiconductor device, a chip manufacturer can allow for the circuits on a chip to change while it is in operation or before shipping the chip to the downstream customers.

In an e-fuse burning operation, signals are input from a semiconductor testing apparatus to a semiconductor device through a plurality of probes of the semiconductor testing apparatus in contact with a plurality of pads of the semiconductor device. Burning cannot be properly performed if probes and pads are not in appropriate contact.

BRIEF SUMMARY OF THE INVENTION

An objective of the present disclosure is to provide a semiconductor device with contact check circuitry. The semiconductor device includes a contact check circuit capable of checking, when the semiconductor device is under test with a semiconductor testing apparatus connecting to at least two pads of the semiconductor device, for example, contact connections to the at least two pads to generate a check result signal.

To achieve at least the above objective, the present disclosure provides a semiconductor device with contact check circuitry. The semiconductor device comprises a plurality of pads, an internal circuit, and a contact check circuit. The plurality of pads includes a first pad and a second pad. The internal circuit is coupled to the plurality of pads. The contact check circuit, at least coupled to the first pad and the second pad, is used for checking, when the semiconductor device is under test, contact connections to the first pad and the second pad to generate a check result signal according to comparison of a first test signal and a second test signal received from the first pad and the second pad with at least one reference signal.

In some embodiments, the contact check circuit comprises a voltage detection circuit and a comparison circuit. The voltage detection circuit, coupled to the first pad and the second pad, is used for generating at least one voltage detection signal. The comparison circuit, coupled to the voltage detection circuit, is used for generating the check result signal according to the at least one voltage detection signal and the at least one reference signal.

In some embodiments, the voltage detection circuit comprises a voltage divider, coupled between the first pad and the second pad, for generating the at least one voltage detection signal.

In some embodiments, the comparison circuit comprises a comparator to generate the check result signal according to the at least one voltage detection signal and the at least one reference signal.

In some embodiments, the at least one reference signal includes a first reference signal and a second reference signal, the comparison circuit is configured to generate a first comparison signal according to the at least one voltage detection signal and the first reference signal; and the comparison circuit is configured to generate a second comparison signal according to the at least one voltage detection signal and the second reference signal, wherein comparison circuit is configured to generate the check result signal according to the first comparison signal and the second comparison signal.

In some embodiments, the comparison circuit comprises a first comparator, a second comparator, and a logic unit. The first comparator for generating the first comparison signal according to the at least one voltage detection signal and the first reference signal. The second comparator for generating the second comparison signal according to the at least one voltage detection signal and the second reference signal. The logic unit, coupled to the first comparator and the second comparator, is used for generating the check result signal according to the first comparison signal and the second comparison signal.

In some embodiments, the at least one voltage detection signal includes a first voltage detection signal and a second voltage detection signal, and the voltage detection circuit is configured to generate the first voltage detection signal according to the first test signal and a first power supply signal; and the voltage detection circuit is configured to generate the second voltage detection signal according to a second power supply signal and the second test signal.

In some embodiments, the at least one voltage detection signal includes a first voltage detection signal and a second voltage detection signal, and the voltage detection circuit comprises a first voltage divider and a second voltage divider. The first voltage divider, coupled between the first pad and a first power supply terminal, is used for generating the first voltage detection signal. The second voltage divider, coupled between a second power supply terminal and the second pad, is used for generating the second voltage detection signal.

In some embodiments, the at least one voltage detection signal includes a first voltage detection signal and a second voltage detection signal; the at least one reference signal includes the first reference signal and the second reference signal; the comparison circuit is configured to generate a first comparison signal according to the first voltage detection signal and the first reference signal; and the comparison circuit is configured to generate a second comparison signal according to the second voltage detection signal and the second reference signal, wherein the comparison circuit is configured to generate the check result signal according to the first comparison signal and the second comparison signal.

In some embodiments, the comparison circuit comprises a first comparator, a second comparator, and a logic unit. The first comparator is used for generating the first comparison signal according to the first voltage detection signal and the first reference signal. The second comparator is used for generating the second comparison signal according to the second voltage detection signal and the second reference signal. The logic unit is used for generating the check result signal according to the first comparison signal and the second comparison signal.

In some embodiments, the internal circuit comprises an electronic fuse, the first pad and the second pad are coupled between the electronic fuse.

In some embodiments, the semiconductor device further comprises an output logic circuit for generating a test result signal according to the check result signal and a response code.

As such, the embodiments of the semiconductor device with contact check circuitry are provided. The semiconductor device includes a contact check circuit capable of checking, when the semiconductor device is under test with a semiconductor testing apparatus connecting to at least two pads of the semiconductor device, for example, contact connections to the at least two pads to generate a check result signal. The check result signal can be used to indicate whether the contact connections to the first pad and the second pad have failed or not and the semiconductor testing apparatus can be configured to determine whether to proceed with the test according to the check result signal. Thus, reliability of the test for the semiconductor device can be enhanced.

DETAILED DESCRIPTION OF THE INVENTION

To facilitate understanding of the object, characteristics and effects of this present disclosure, embodiments together with the attached drawings for the detailed description of the present disclosure are provided.

Figure 1:
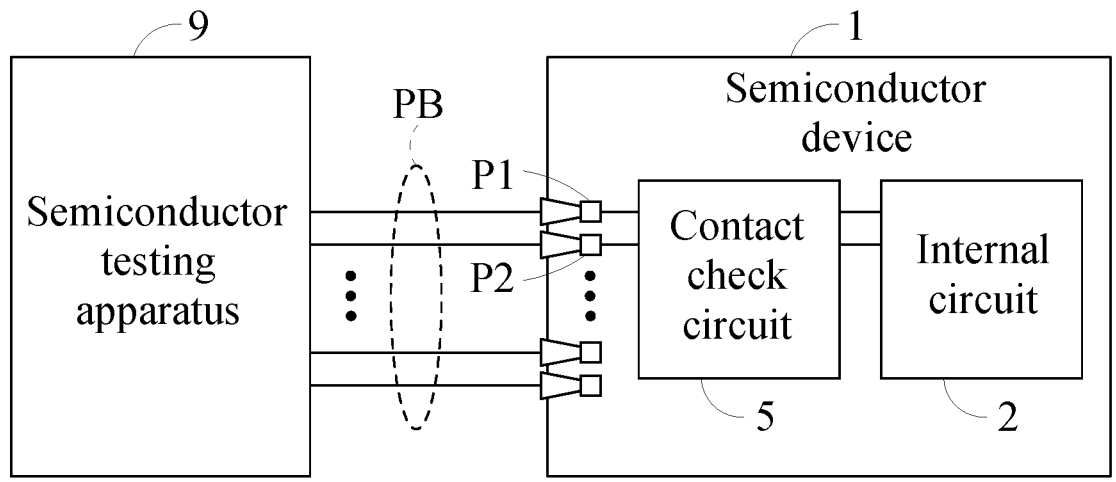
FIG. 1 is a schematic diagram illustrating exemplary architecture of a semiconductor device with contact check circuitry, representative of various embodiments of the present disclosure, wherein the semiconductor device is under test by a semiconductor testing apparatus.

Referring to FIG. 1, exemplary architecture of a semiconductor device 1 with contact check circuitry is illustrated, representative of various embodiments of the present disclosure.

As shown in FIG. 1, a semiconductor device 1 comprises a plurality of pads, an internal circuit 2, and a contact check circuit 5. The plurality of pads includes a first pad P1 and a second pad P2. The internal circuit 2 is coupled to the plurality of pads. The contact check circuit 5, at least coupled to the first pad P1 and the second pad P2, is used for checking, when the semiconductor device 1 is under test with a semiconductor testing apparatus 9 connecting (e.g., using test probes) to the first pad P1 and the second pad P2, contact connections to the first pad P1 and the second pad P2 to generate a check result signal according to comparison of a first test signal and a second test signal received from the first pad P1 and the second pad P2 with at least one reference signal.

In a practical scenario, the internal circuit 2 may include a circuit for specific purpose (e.g., a controller, memory, logic circuits, and so on) and an e-fuse unit including one or more e-fuses for selectively changing the functionality or operations of the circuit. In a testing of an e-fuse burning operation, signals are input from the semiconductor testing apparatus 9 to the semiconductor device 1 through a plurality of probes PB of the semiconductor testing apparatus 9 in contact with the plurality of pads of the semiconductor device 1. Burning cannot be properly performed if the probes PB and the pads are not in appropriate contact. In this scenario, the check result signal can be utilized to indicate whether the contact connections to the first pad P1 and the second pad P2 are proper for the test.

Figure 2:
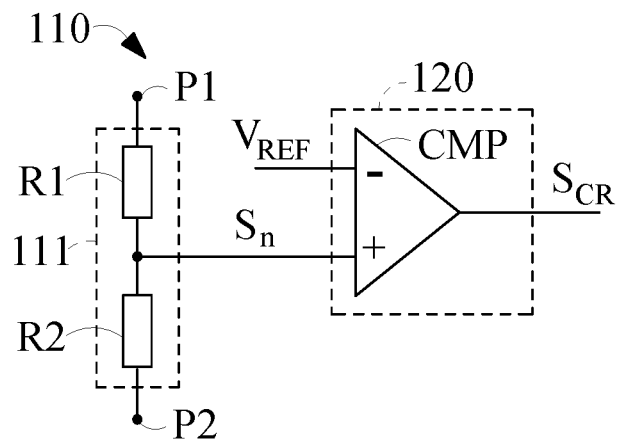
FIG. 2 is a block diagram of an embodiment of a contact check circuit for use in the exemplary architecture of FIG. 1.
Figure 3:
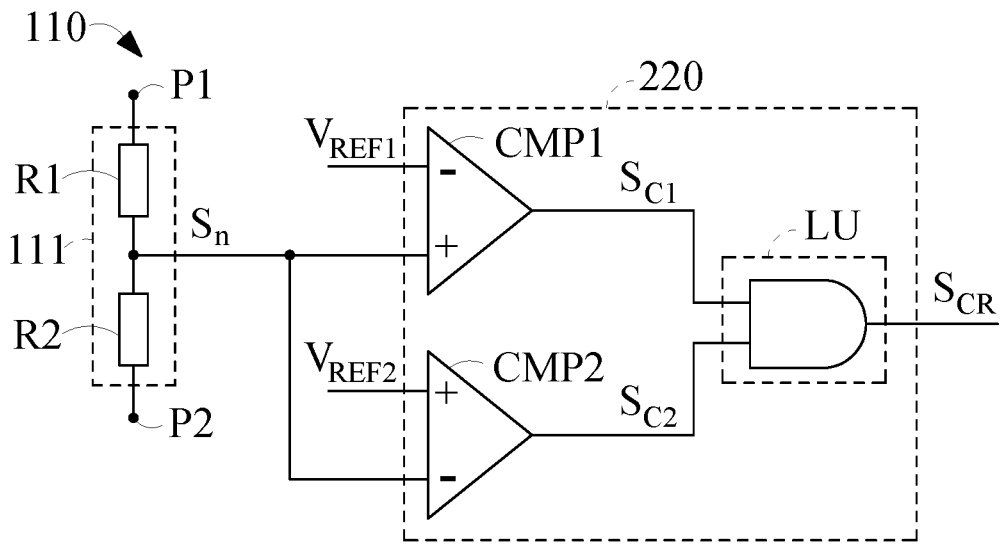
FIG. 3 is a block diagram illustrating another embodiment of a contact check circuit for use in the exemplary architecture of FIG. 1.
Figure 4:
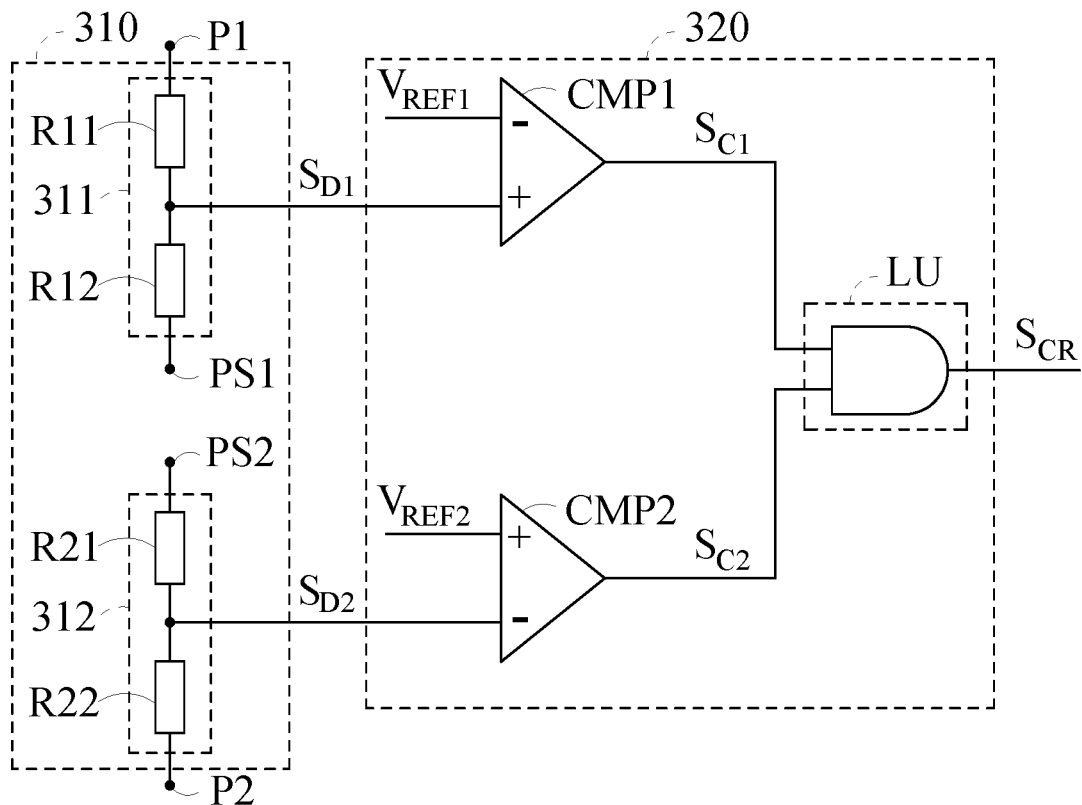
FIG. 4 is a block diagram illustrating yet another embodiment of a contact check circuit for use in the exemplary architecture of FIG. 1.

In some embodiments, the contact check circuit 5 can be implemented to include a voltage detection circuit (e.g., 110 in FIG. 2 or 310 in FIG. 4) and a comparison circuit (e.g., 120 in FIG. 2, 220 in FIG. 3, or 320 in FIG. 4). The voltage detection circuit, coupled to the first pad P1 and the second pad P2, is used for generating at least one voltage detection signal (e.g., indicated by $S_n$ in FIGS. 2, 3; $S_{D1}$ and $S_{D2}$ in FIG. 4). The comparison circuit, coupled to the voltage detection circuit, is used for generating the check result signal (e.g., indicated by $S_{CR}$) according to the at least one voltage detection signal and the at least one reference signal (e.g., indicated by $V_{REF}$ in FIG. 2; or $V_{REF1}$ and $V_{REF2}$ in FIGS. 3, 4). The at least one reference signal, for example, can be obtained by one or more bandgap voltage circuits of the semiconductor circuit 1 or external power supplies or voltage sources.

Referring to FIG. 2, an embodiment of a contact check circuit is illustrated for use in the exemplary architecture of FIG. 1. In FIG. 2, a contact check circuit 10 includes a voltage detection circuit 110 and a comparison circuit 120.

In an example, the voltage detection circuit 110 includes a voltage divider 111, coupled between the first pad P1 and the second pad P2, for generating a voltage detection signal $S_n$.

For example, the comparison circuit 120 comprises a comparator CMP to generate a check result signal $S_{CR}$ according to the voltage detection signal $S_n$ and a reference signal $V_{REF}$.

By way of the embodiment as illustrated in FIG. 2, the contact check circuit 10 can be configured or designed to indicate whether the contact connections of the probes to the first pad P1 and the second pad P2 have failed. For example, it is supposed that the semiconductor device 1 is implemented to include the first pad P1 and the second pad P2 designed for receiving required a positive supply voltage and a negative supply voltage such as DC (direct current) voltages of 4 V and −2 V respectively. For indicating whether the contact connections being proper or reliable during a test, the voltage divider 111 can be designed by setting the resistance values of resistors R1 and R2 so that the detection signal $S_n$ (e.g., voltage signal level (magnitude)) is equal to or greater than the reference signal $V_{REF}$ (e.g., $V_{REF}=1.25$ V) and the check result signal $S_{CR}$ is then output at, for example, a logic high level, indicating that the contact connections are proper accordingly when the first pad P1 and the second pad P2 actually receive the required voltage supply signals. Conversely, during a test, if the first pad P1 and the second pad P2 are not in appropriate contact with the respective probes, the detection signal $S_n$ will be less than the reference signal $V_{REF}$ (e.g., $V_{REF}=1.25$ V), the check result signal $S_{CR}$ is then output at, for example, a logic low level, indicating that the contact connections have failed.

In order to perform contact check more accurately, the contact check circuit 5 can be implemented in a manner so that the detection signal (e.g., $S_n$ in FIG. 2) is compared with two or more reference signals indicating different reference values, rather than one reference signal (e.g., $V_{REF}$) in FIG. 2.

Referring to FIG. 3, another embodiment of a contact check circuit for use in the exemplary architecture of FIG. 1 is illustrated. In FIG. 3, a contact check circuit 20 includes a voltage detection circuit 110 and a comparison circuit 220. The contact check circuit 20 of FIG. 3 differs from the contact check circuit 10 of FIG. 2 in that: the at least one reference signal includes a first reference signal $V_{REF1}$ and a second reference signal $V_{REF2}$; and the comparison circuit 220 of the contact check circuit 20 is configured to generate a first comparison signal $S_{C1}$ according to the voltage detection signal $S_n$ and the first reference signal $V_{REF1}$, to generate a second comparison signal $S_{C2}$ according to the voltage detection signal $S_n$ and the second reference signal $V_{REF2}$, and to generate the check result signal $S_{CR}$ according to the first comparison signal $S_{C1}$ and the second comparison signal $S_{C2}$.

As illustrated in FIG. 3, the comparison circuit 220 comprises a first comparator CMP1, a second comparator CMP2, and a logic unit LU.

The first comparator CMP1 is used for generating the first comparison signal $S_{C1}$ according to the voltage detection signal $S_n$ and the first reference signal $V_{REF1}$. For example, the first comparator CMP1 has a non-inverting terminal for receiving the voltage detection signal $S_n$ and an inverting terminal for receiving the first reference signal $V_{REF1}$.

The second comparator CMP2 is used for generating the second comparison signal $S_{C2}$ according to the voltage detection signal $S_n$ and the second reference signal $V_{REF2}$. For example, the second comparator CMP2 has a non-inverting terminal for receiving the second reference signal $V_{REF2}$ and an inverting terminal for receiving the voltage detection signal $S_n$.

The logic unit LU, coupled to the first comparator CMP1 and the second comparator CMP2, is used for generating the check result signal $S_{CR}$ according to the first comparison signal $S_{C1}$ and the second comparison signal $S_{C2}$. In an example, the logic unit LU includes an AND gate for receiving the first comparison signal $S_{C1}$ and the second comparison signal $S_{C2}$ and for outputting the check result signal $S_{CR}$.

As exemplified in FIG. 3, the comparison circuit 220 can be implemented to determine whether the voltage detection signal $S_n$ lying between the first reference signal $V_{REF1}$ and the second reference signal $V_{REF2}$ (e.g., $V_{REF1} \leq S_n \leq V_{REF2}$). For example, the first reference signal $V_{REF1}$ and the second reference signal $V_{REF2}$ can be set to voltage values $V_{REF}$ D and $V_{REF}$ D, respectively (e.g., $V_{REF}$=1.25 V, D=0.25 V).

By way of the embodiment as illustrated in FIG. 3, the contact check circuit 20 can be configured or designed to indicate whether the contact connections of the probes to the first pad P1 and the second pad P2 have failed. For example, it is supposed that the semiconductor device 1 is implemented to include the first pad P1 and the second pad P2 designed for receiving required a positive supply voltage and a negative supply voltage such as DC (direct current) voltages of 4 V and –2 V respectively. For indicating whether the contact connections being proper or reliable during a test, the voltage divider 111 of the voltage detection circuit 110 can be designed by setting the resistance values of resistors R1 and R2 so that the detection signal $S_n$ (e.g., voltage signal level (magnitude)) lies between the first reference signal $V_{REF1}$ and the second reference signal $V_{REF2}$ (e.g., $V_{REF1} \leq S_n \leq V_{REF2}$) and the check result signal $S_{CR}$ is then output at, for example, a logic high level, indicating that the contact connections are proper accordingly when the first pad P1 and the second pad P2 actually receive the required voltage supply signals. Conversely, during a test, if the first pad P1 and the second pad P2 are not in appropriate contact with the respective probes, the detection signal $S_n$ will be less than the first reference signal $V_{REF1}$ (e.g., $V_{REF1}$=1.0 V) or greater than the second reference signal $V_{REF2}$ (e.g., $V_{REF2}$=1.5 V), the check result signal $S_{CR}$ is then output at, for example, a logic low level, indicating that the contact connections are failed. For example, if the first pad P1 receives a positive supply voltage properly (e.g., 4 V) and the second pad P2 does not receive a negative supply voltage properly (e.g., because a corresponding probe does not contact the second pad P2 or the contact is improper), the detection signal $S_n$ (e.g., 2 V, 3 V, 3.8 V or 4 V) is probably greater than the second reference signal $V_{REF2}$ (e.g., $V_{REF2}$=1.5 V). In another example, conversely, if the first pad P1 does not receive a positive supply voltage properly (e.g., because a corresponding probe does not contact the first pad P1 or the contact is improper) and the second pad P2 receives a negative supply voltage properly (e.g., –2 V), the detection signal $S_n$ (e.g., –2 V, –1 V, 0 V or 0.5 V) is probably less than the second reference signal $V_{REF2}$ (e.g., $V_{REF1}$=1.0 V).

In order to perform contact check more accurately, the contact check circuit 5 can be implemented in another manner so that two corresponding detection signals (e.g., $S_{D1}$ or $S_{D2}$ in FIG. 4), rather than one detection signal (e.g., $S_n$) in FIG. 2 or 3, can be derived from the first test signal received from the first pad P1 and the second test signal received from the second pad P2.

Referring to FIG. 4, another embodiment of a contact check circuit for use in the exemplary architecture of FIG. 1 is illustrated. In FIG. 4, a contact check circuit 30 includes a voltage detection circuit 310 and a comparison circuit 320. The contact check circuit 30 of FIG. 4 differs from the contact check circuit 20 of FIG. 3 in that: the at least one voltage detection signal includes a first voltage detection signal $S_{D1}$ and a second voltage detection signal $S_{D2}$; and the voltage detection circuit 310 of the contact check circuit 30 is configured to generate the first voltage detection signal $S_{D1}$ according to the first test signal and a first power supply signal and to generate the second voltage detection signal $S_{D2}$ according to a second power supply signal and the second test signal. In addition, the comparison circuit 320 of the contact check circuit 30 is configured to generate a first comparison signal $S_{C1}$ according to the first voltage detection signal $S_{D1}$ and the first reference signal $V_{REF1}$, and to generate a second comparison signal $S_{C2}$ according to the second voltage detection signal $S_{D2}$ and the second reference signal $V_{REF2}$.

As illustrated in FIG. 4, the voltage detection circuit 310, for example, comprises a first voltage divider 311 and a second voltage divider 312. The first voltage divider 311, coupled between the first pad P1 and a first power supply terminal PS1, is used for generating the first voltage detection signal $S_{D1}$. The second voltage divider 312, coupled between a second power supply terminal PS2 and the second pad P2, is used for generating the second voltage detection signal $S_{D2}$. For example, the first power supply terminal PS1 and the second power supply terminal PS2

As illustrated in FIG. 4, the comparison circuit 320 comprises a first comparator CMP1, a second comparator CMP2, and a logic unit LU. As compared with the comparison circuit 220 of FIG. 3, the comparison circuit 320 receives the first voltage detection signal $S_{D1}$ and the second voltage detection signal $S_{D2}$, rather than one voltage detection signal $S_n$.

The first comparator CMP1 of the comparison circuit 320 is used for generating the first comparison signal $S_{C1}$ according to the first voltage detection signal $S_{D1}$ and the first reference signal $V_{REF1}$. For example, the first comparator CMP1 has a non-inverting terminal for receiving the first voltage detection signal $S_{D1}$ and an inverting terminal for receiving the first reference signal $V_{REF1}$.

The second comparator CMP2 of the comparison circuit 320 is used for generating the second comparison signal $S_{C2}$ according to the second voltage detection signal $S_{D2}$ and the second reference signal $V_{REF2}$. For example, the second comparator CMP2 has a non-inverting terminal for receiving the second reference signal $V_{REF2}$ and an inverting terminal for receiving the second voltage detection signal $S_{D2}$.

The logic unit LU of the comparison circuit 320, coupled to the first comparator CMP1 and the second comparator CMP2, is used for generating the check result signal $S_{CR}$ according to the first comparison signal $S_{C1}$ and the second comparison signal $S_{C2}$. For example, the logic unit LU of the comparison circuit 320 is similar to that of the comparison circuit 220.

As exemplified in FIG. 4, the comparison circuit 320 can be implemented to determine whether the first voltage detection signal $S_{D1}$ is greater than or equal to the first reference signal $V_{REF1}$ and the second reference signal $V_{REF2}$ is greater than the second reference signal $V_{REF2}$ (e.g., $S_{D1} \geq V_{REF1}$ and $V_{REF2} \geq S_{D2}$). For example, the first reference signal $V_{REF1}$ and the second reference signal $V_{REF2}$ can be set to the different voltage values or the same voltage values.

By way of the embodiment as illustrated in FIG. 4, the contact check circuit 30 can be configured or designed to indicate whether the contact connections of the probes to the first pad P1 and the second pad P2 have failed. For example, it is supposed that the semiconductor device 1 is implemented to include the first pad P1 and the second pad P2 designed for receiving required a positive supply voltage and a negative supply voltage such as DC (direct current) voltages of 4 V and −2 V respectively. For indicating whether the contact connections being proper or reliable during a test, the voltage divider 311 and the voltage divider 312 can be designed by setting the resistance values of resistors R11, R12, R21, and R22 so that the first voltage detection signal $S_{D1}$ is greater than or equal to the first reference signal $V_{REF1}$ and the second reference signal $V_{REF2}$ is greater than or equal to the second reference signal $V_{REF2}$ (e.g., $S_{D1} \geq V_{REF1}$ and $V_{REF2} \geq S_{D2}$, wherein $V_{REF1} \geq V_{REF2}$) and the check result signal $S_{CR}$ is then output at, for example, a logic high level, indicating that the contact connections are proper accordingly when the first pad P1 and the second pad P2 actually receive the required voltage supply signals. Conversely, during a test, if one of the first pad P1 and the second pad P2 is not in appropriate contact with the corresponding probe, the first detection signal $S_{D1}$ will be less than the first reference signal $V_{REF1}$ (e.g., $S_{D1} < V_{REF1}$) or the second reference signal $V_{REF2}$ will be the second detection signal $S_{D2}$ will be less than the first reference signal $V_{REF1}$ (e.g., $S_{D2} < V_{REF2}$), the check result signal $S_{CR}$ is then output at, for example, a logic low level, indicating that the contact connections are failed. As such, the contact check can be performed more accurately by way of the contact check circuit 30.

In some embodiments, the logic unit LU of the contact check circuit 20 or 30 may include one or more logic gates, such as AND, OR, NOT, XOR, or XNOR gate, or any combination thereof whenever appropriate, for the same purpose of outputting the check result signal $S_{CR}$. For instance, in a case where the configuration of the first comparator CMP1 of the contact check circuit 20 is modified to have its non-inverting and inverting terminals receiving the first reference signal $V_{REF1}$ and the voltage detection signal $S_n$ respectively, the logic unit LU of the contact check circuit 20 can be changed to another logic circuit to perform a Boolean equation of $(S_{C1}'+S_{C2})'$ with a NOT gate and NOR gate, for the same purpose of outputting the check result signal $S_{CR}$. The logic unit LU of the contact check circuit 30 can be implemented in this manner similarly. Further, other modifications of the logic unit LU are possible. Accordingly, the implementation of the invention is not limited to the examples.

In some embodiments, the semiconductor device 1 can be configured to have its contact check circuit 5 implemented based on the contact check circuit 10, 20, or 30 as illustrated in FIG. 2, 3, or 4 to perform contact check on at least the first pad P1 and the second pad P2 during a test. In response to a test request signal from the semiconductor testing apparatus 9, the semiconductor device 1 can then output, to the semiconductor testing apparatus 9, the check result signal $S_{CR}$ as a test result signal or output a test result signal according to the check result signal $S_{CR}$ and one or more additional results that can be obtained from an additional logical test performed in the semiconductor device 1.

Figure 5:
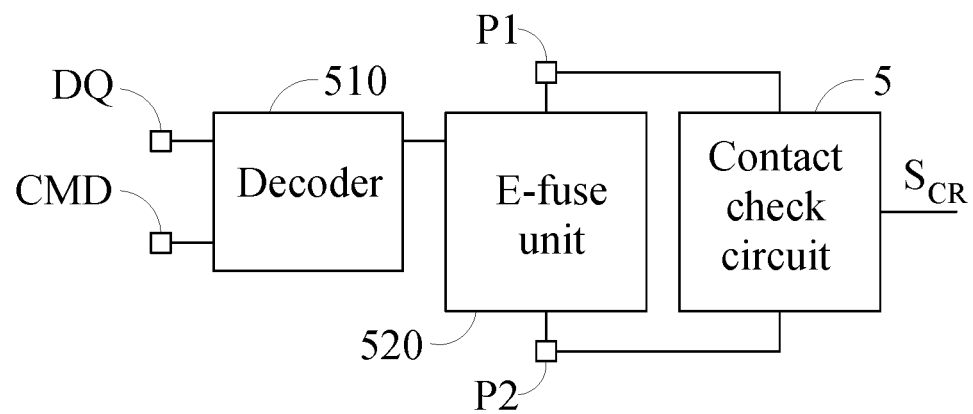
FIG. 5 is a block diagram illustrating an embodiment of a semiconductor device for use in the exemplary architecture of FIG. 1.

Referring to FIG. 5, an embodiment of a semiconductor device for use in the exemplary architecture of FIG. 1 is illustrated. In FIG. 5, a semiconductor device 1A, as an embodiment of the semiconductor device 1, includes a plurality of pads, an internal circuit, and a contact check circuit 5.

The plurality of pads includes a first pad P1, a second pad P2, a data terminal DQ, and a command terminal CMD. The internal circuit is coupled to the plurality of pads.

The internal circuit may include a decoder 510 and an e-fuse unit 520. The decoder 510 coupled to the data terminal DQ, the command terminal CMD, and the e-fuse unit 520. The e-fuse unit 520 can include a plurality of e-fuses. For example, two terminals of at least one of the plurality of e-fuses are coupled to the first pad P1 and the second pad P2. As shown in FIG. 5, the first pad P1 and the second pad P2 are coupled to the contact check circuit 5 as well.

The decoder 510 can be implemented to perform different modes in response to a data signal and a command signal received from the data terminal DQ and the command terminal CMD. For example, before a burning e-fuse operation, a test is to be performed. The semiconductor testing apparatus 9 generates a data signal, a command signal, a positive supply voltage, and a negative supply voltage to the data terminal DQ, the command terminal CMD, the first pad P1, and the second pad P2, respectively. The data signal indicates a specific code or address and the command signal indicates a test command for checking whether the semiconductor device 1A is ready for e-fuse burning operation. If the semiconductor device 1A is ready logically, the decoder 510 can generate a response code (e.g., 110011001100) in response to the data signal and the command signal.

On the other hand, the contact check circuit 5, as illustrated in FIG. 2, 3, or 4, checks contact connections to the first pad P1 and the second pad P2 to generate a check result signal $S_{CR}$ according to comparison of a first test signal and a second test signal received from the first pad P1 and the second pad P2 with at least one reference signal.

In an embodiment, the response code generated from the decoder 510 and the check result signal $S_{CR}$ generated by the contact check circuit 5 can be sent back to the semiconductor testing apparatus 9.

Figure 6:
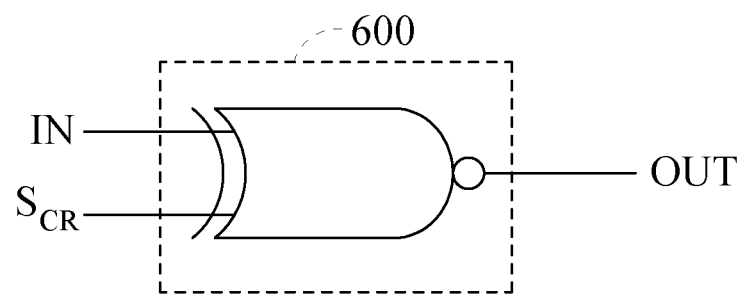
FIG. 6 is a schematic diagram illustrating an embodiment of an output logic unit for use in the exemplary architecture of FIG. 1.

In another embodiment, as shown in FIG. 6, the semiconductor device 1A can further include an output logic unit 600 for generating a test result signal OUT according to the check result signal $S_{CR}$ and the response code (e.g., indicated by IN). For example, the output logic unit 600 may include an exclusive NOR gate. If the response code IN, for example, "110011001100" in binary, indicates the semiconductor device 1A is ready logically and the check result signal $S_{CR}$ (e.g., logic 1) indicates the contact connections are proper, the test result signal OUT indicates the same code as the response code IN. If the response code IN indicates the semiconductor device 1A is ready logically and the check result signal $S_{CR}$ (e.g., logic 0) indicates the contact connections are not proper, the test result signal OUT indicates "001100110011" in binary. In another example, the output logic unit 600 may include one or more logic gates, such as AND, OR, NOT, XOR, or XNOR gate, or any combination thereof whenever appropriate.

In this manner, the semiconductor testing apparatus 9 can be implemented to stop the test once receiving the test result signal OUT, for example, indicating that the contact connections are failed (e.g., "001100110011"). As such, the semiconductor device 1A using the contact check circuit 5, as illustrated in FIG. 2, 3, or 4, can facilitate prevention of the semiconductor testing apparatus 9 from mistakenly performing the test or even a burning operation (e.g., for e-fuses), when the probes and the pads are not properly connected.

As such, the embodiments of the semiconductor device with contact check circuitry are provided. The semiconductor device includes a contact check circuit capable of checking, when the semiconductor device is under test with a semiconductor testing apparatus connecting to at least two pads of the semiconductor device, for example, contact connections to the at least two pads to generate a check result signal. The check result signal can be used to indicate whether the contact connections to the first pad and the second pad have failed or not and the semiconductor testing apparatus can be configured to determine whether to proceed with the test according to the check result signal. Thus, reliability of the test for the semiconductor device can be enhanced.

While the present disclosure has been described by way of specific embodiments, numerous modifications, combinations, and variations could be made thereto by those skilled in the art without departing from the scope and spirit of the present disclosure set forth in the claims.

What is claimed is:

1. A semiconductor device with contact check circuitry, comprising:
   a plurality of pads including a first pad and a second pad;
   a voltage detection circuit, coupled to the first pad and the second pad, for generating at least one voltage detection signal;
   wherein the at least one voltage detection signal includes a first voltage detection signal and a second voltage detection signal, and the voltage detection circuit comprises:
   a first voltage divider, coupled between the first pad and a first power supply terminal, for generating the first voltage detection signal; and
   a second voltage divider, coupled between a second power supply terminal and the second pad, for generating the second voltage detection signal;
   an internal circuit coupled to the plurality of pads; and
   a contact check circuit, at least coupled to the first pad and the second pad, for comparing a first test signal received from the first pad and at least one reference signal and comparing a second test signal received from the second pad and at least one reference signal and then generating a check result signal according to these comparisons.

2. The semiconductor device according to claim 1, wherein the contact check circuit comprises:
   a comparison circuit, coupled to the voltage detection circuit, for generating the check result signal.

3. The semiconductor device according to claim 2, wherein the at least one reference signal includes a first reference signal and a second reference signal;
   the comparison circuit is configured to generate a first comparison signal according to the first voltage detection signal and the first reference signal; and
   the comparison circuit is configured to generate a second comparison signal according to the second voltage detection signal and the second reference signal,
   wherein the comparison circuit is configured to generate the check result signal according to the first comparison signal and the second comparison signal.

4. The semiconductor device according to claim 3, wherein the comparison circuit comprises:
   a first comparator for generating the first comparison signal according to the first voltage detection signal and the first reference signal;
   a second comparator for generating the second comparison signal according to the second voltage detection signal and the second reference signal; and
   a logic unit for generating the check result signal according to the first comparison signal and the second comparison signal.

5. The semiconductor device according to claim 1, wherein
   the voltage detection circuit is configured to generate the first voltage detection signal according to the first test signal and a first power supply signal; and
   the voltage detection circuit is configured to generate the second voltage detection signal according to a second power supply signal and the second test signal.

6. The semiconductor device according to claim 1, wherein the internal circuit comprises an electronic fuse, the electronic fuse is coupled between the first pad and the second pad.

7. The semiconductor device according to claim 1, wherein the semiconductor device further comprises an output logic circuit for generating a test result signal according to the check result signal and a response code.

* * * * *